United States Patent
Borsari

(10) Patent No.: US 10,157,841 B2
(45) Date of Patent: Dec. 18, 2018

(54) CONSTRUCTION OF INTEGRATED CIRCUITRY AND A METHOD OF FORMING AN ELEVATIONALLY-EXTENDING CONDUCTOR LATERALLY BETWEEN A PAIR OF STRUCTURES

(71) Applicant: Micron Technology, Inc., Boise, ID (US)

(72) Inventor: Silvia Borsari, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/489,311

(22) Filed: Apr. 17, 2017

(65) Prior Publication Data
US 2018/0301412 A1 Oct. 18, 2018

(51) Int. Cl.
*H01L 23/552* (2006.01)
*H01L 27/105* (2006.01)
(Continued)

(52) U.S. Cl.
CPC .... *H01L 23/5283* (2013.01); *H01L 21/02126* (2013.01); *H01L 21/02164* (2013.01);
(Continued)

(58) Field of Classification Search
CPC . H01L 23/528; H01L 23/5329; H01L 23/535; H01L 27/10885; H01L 27/10888
See application file for complete search history.

(56) References Cited

U.S. PATENT DOCUMENTS 8,716,116 B2 5/2014 Parekh et al.
2004/0014278 A1 1/2004 Lee et al.
(Continued)

FOREIGN PATENT DOCUMENTS

WO PCT/US2017/059992 8/2018

OTHER PUBLICATIONS

U.S. Appl. No. 15/210,511, filed Jul. 14, 2016, Micron Technology, Inc.

*Primary Examiner* — Changhyun Yi
(74) *Attorney, Agent, or Firm* — Wells St. John P.S.

(57) ABSTRACT

A method includes forming insulative material along the opposing sides of a conductive via and a conductive line in a vertical cross-section comprising forming a laterally-inner-insulator material comprising silicon, oxygen, and carbon laterally-outward of the opposing sides of the conductive via and the conductive line in the vertical cross-section. A laterally-intervening-insulator material comprising silicon and oxygen is formed laterally-outward of opposing sides of the laterally-inner-insulator material in the vertical cross-section. The laterally-intervening-insulator material comprises less carbon, if any, than the laterally-inner-insulator material. A laterally-outer-insulator material comprising silicon, oxygen, and carbon is formed laterally-outward of opposing sides of the laterally-intervening-insulator material in the vertical cross-section. The laterally-outer-insulator material comprises more carbon than the laterally-inner-insulator material. Elevationally-extending-conductor material is formed laterally between and along the insulative material in the vertical cross-section. Additional method aspects, including structure independent of method of fabrication, are disclosed.

20 Claims, 13 Drawing Sheets

(51) Int. Cl.
   *H01L 23/528*   (2006.01)
   *H01L 23/522*   (2006.01)
   *H01L 21/02*    (2006.01)
   *H01L 27/108*   (2006.01)

(52) U.S. Cl.
   CPC .... *H01L 23/5226* (2013.01); *H01L 27/10814* (2013.01); *H01L 27/10882* (2013.01)

(56) References Cited

U.S. PATENT DOCUMENTS

| | | |
|---|---|---|
| 2008/0064162 A1 | 3/2008 | Cheng et al. |
| 2010/0285662 A1 | 11/2010 | Kim et al. |
| 2011/0121375 A1 | 5/2011 | Kawahara et al. |
| 2011/0266689 A1 | 11/2011 | Tang |
| 2011/0285028 A1* | 11/2011 | Seo ............... H01L 21/3105 257/774 |
| 2012/0199897 A1 | 8/2012 | Chang et al. |
| 2014/0001650 A1 | 1/2014 | Trivedi |
| 2014/0231892 A1 | 8/2014 | Song et al. |
| 2015/0061134 A1 | 3/2015 | Lee et al. |
| 2015/0262625 A1* | 9/2015 | Han ............... H01L 21/764 257/773 |
| 2016/0329343 A1 | 11/2016 | Pachamuthu et al. |

\* cited by examiner

CONSTRUCTION OF INTEGRATED CIRCUITRY AND A METHOD OF FORMING AN ELEVATIONALLY-EXTENDING CONDUCTOR LATERALLY BETWEEN A PAIR OF STRUCTURES

TECHNICAL FIELD

Embodiments disclosed herein pertain to constructions of integrated circuitry and to methods of forming an elevationally-extending conductor laterally between a pair of structures.

BACKGROUND

Memory is one type of integrated circuitry, and is used in computer systems for storing data. Memory may be fabricated in one or more arrays of individual memory cells. Memory cells may be written to, or read from, using digit lines (which may also be referred to as bit lines, data lines, or sense lines) and access lines (which may also be referred to as word lines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or nonvolatile. Nonvolatile memory cells can store data for extended periods of time in the absence of power. Nonvolatile memory is conventionally specified to be memory having a retention time of at least about 10 years. Volatile memory dissipates, and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

One type of memory cell has at least one transistor and at least one capacitor. In some such structures, one conductive via extends downwardly from a sense line to one source/drain region (e.g., a circuit node) of the transistor. Additionally, another conductive via may be laterally-adjacent the one conductive via and extend downwardly from a storage node of the capacitor to another source/drain region of the transistor. Unfortunately, parasitic capacitance exists laterally between the one conductive via and the other conductive via. Such parasitic capacitance can adversely affect circuit performance. Parasitic capacitance laterally between conductive vias in other circuitry can also adversely affect circuit performance.

DETAILED DESCRIPTION OF EXAMPLE EMBODIMENTS

Figure 1:
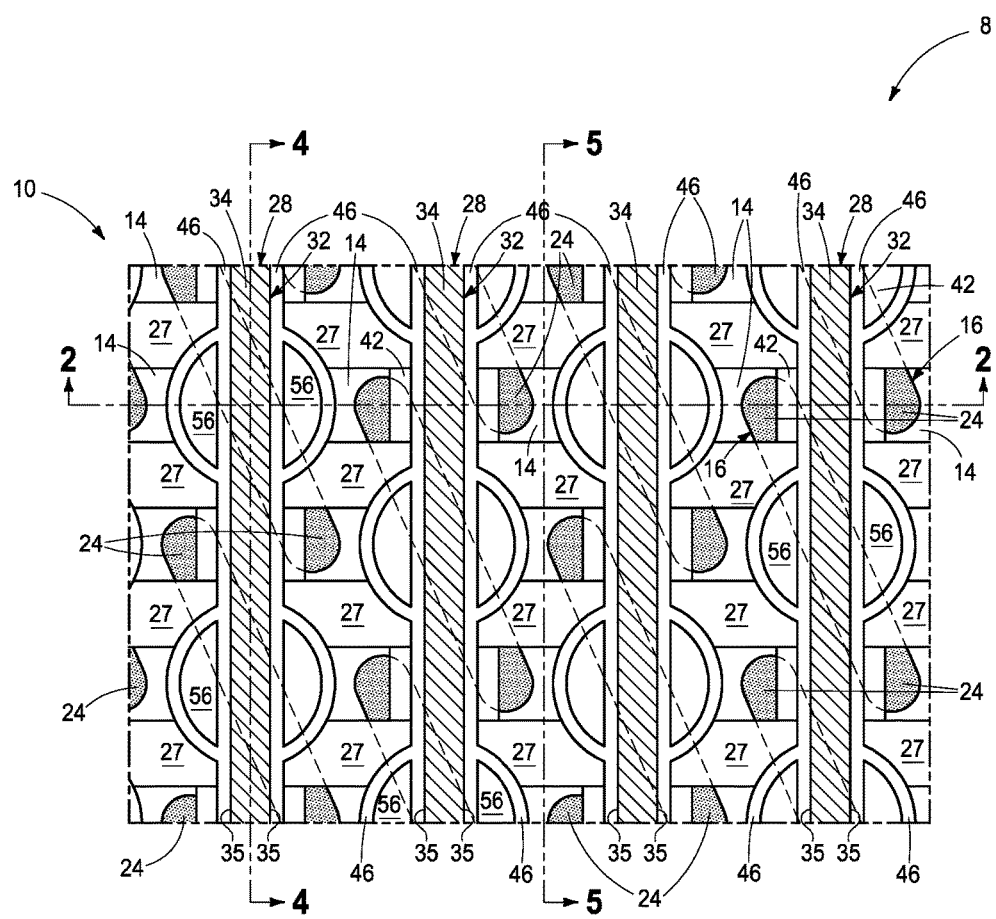
FIG. 1 is a diagrammatic downwardly-looking sectional view of a substrate fragment in process in accordance with an embodiment of the invention, and is taken through line 1-1 in FIG. 2.
Figure 2:
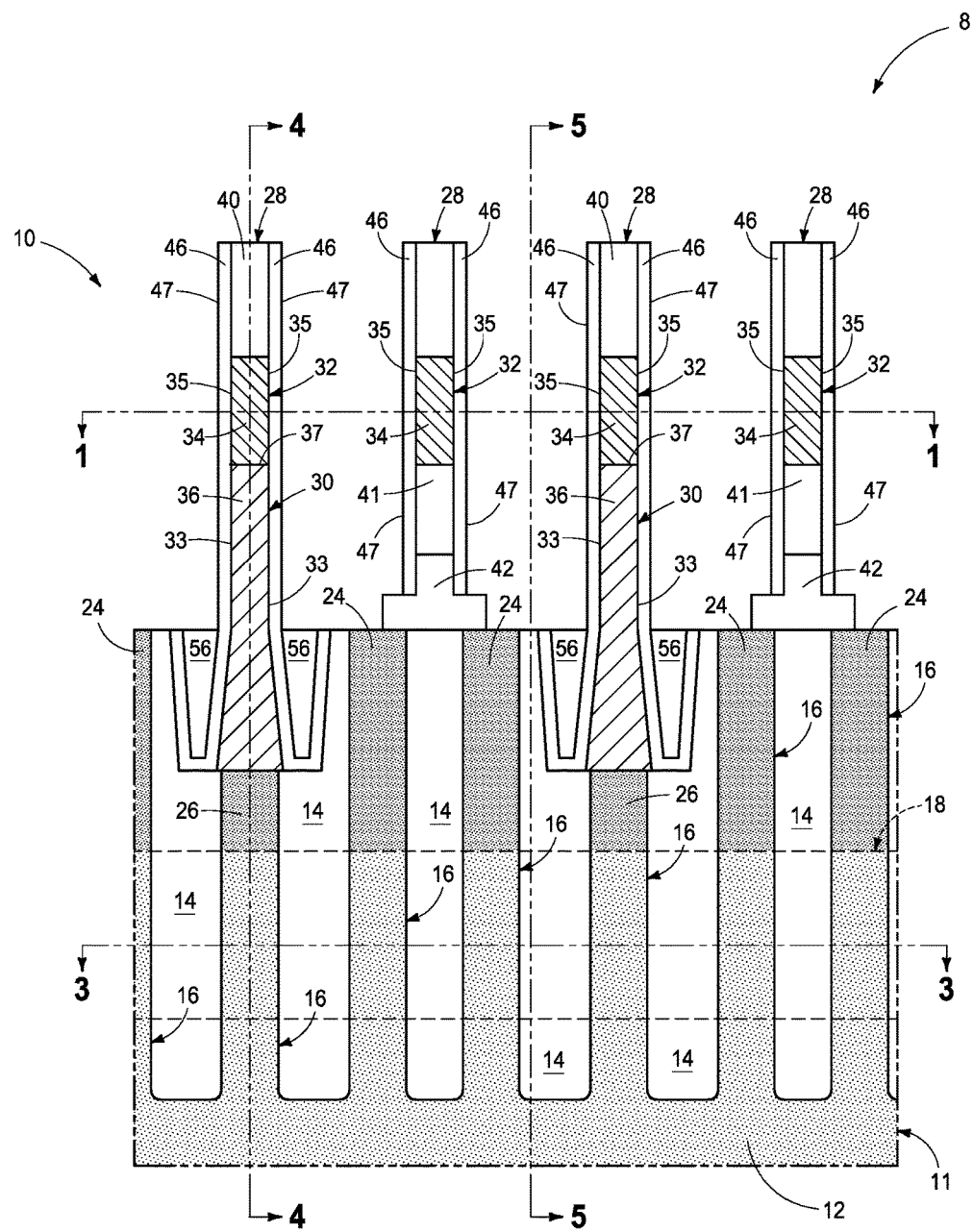
FIG. 2 is a sectional view taken through line 2-2 in FIG. 1.
Figure 3:
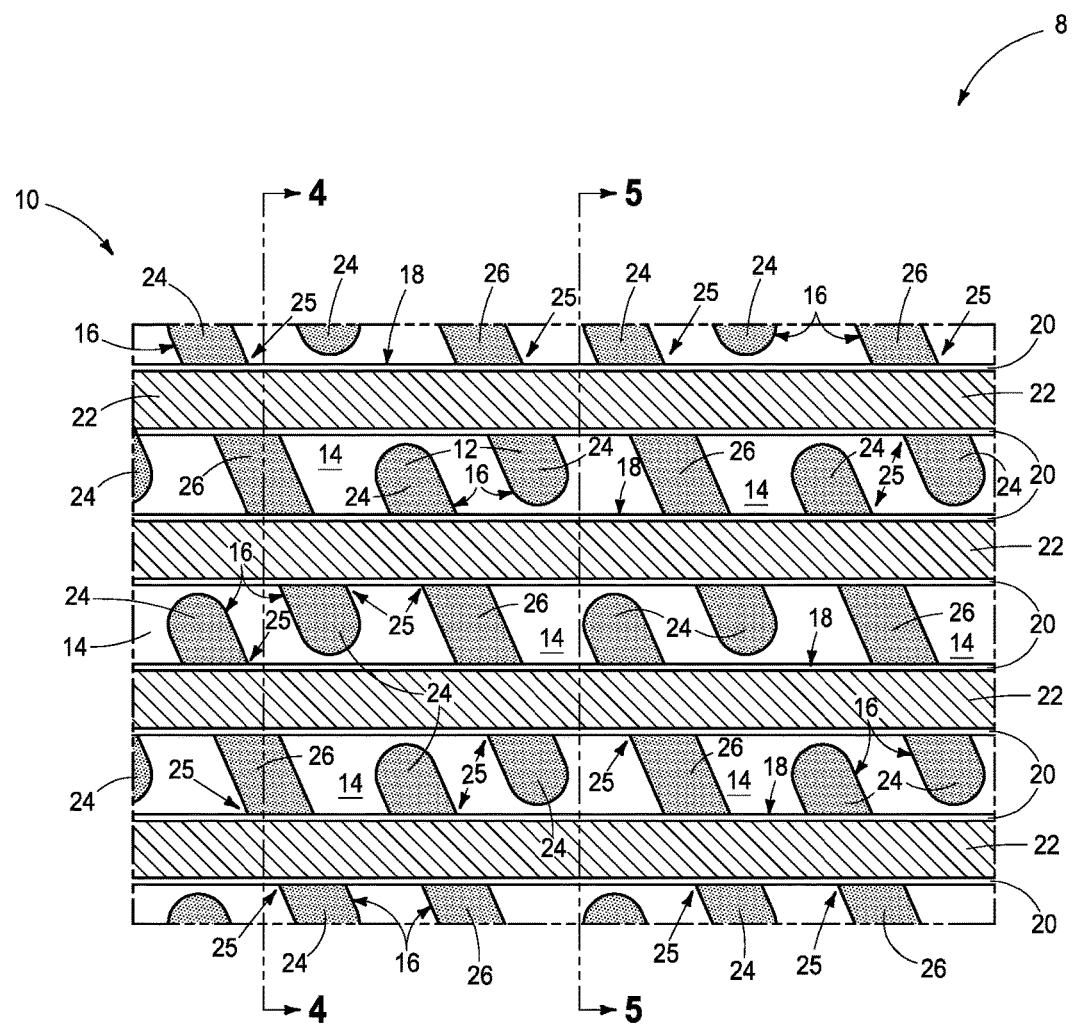
FIG. 3 is a sectional view taken through line 3-3 in FIG. 2.
Figure 4:
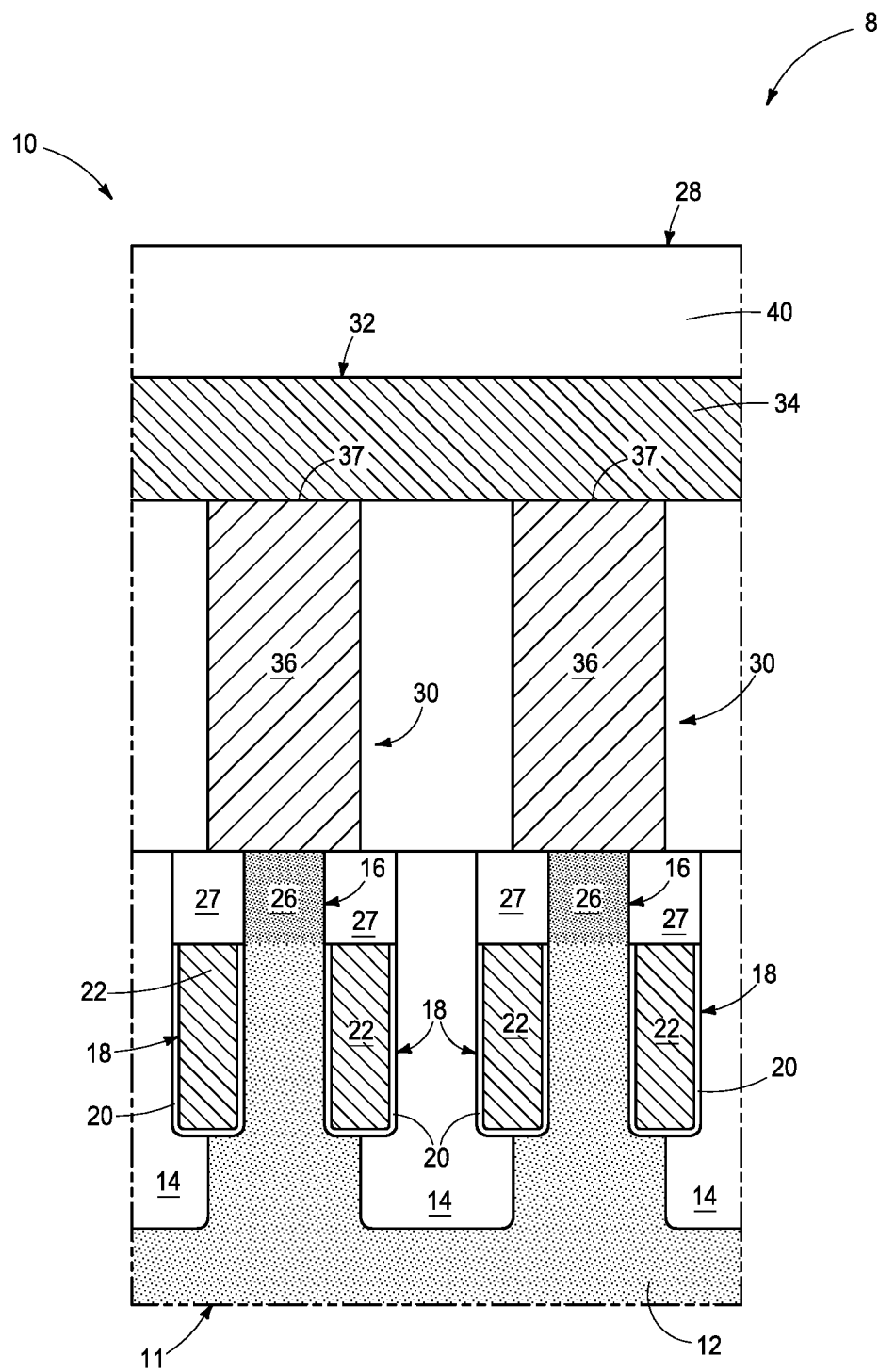
FIG. 4 is a sectional view taken through line 4-4 in FIGS. 1-3.
Figure 5:
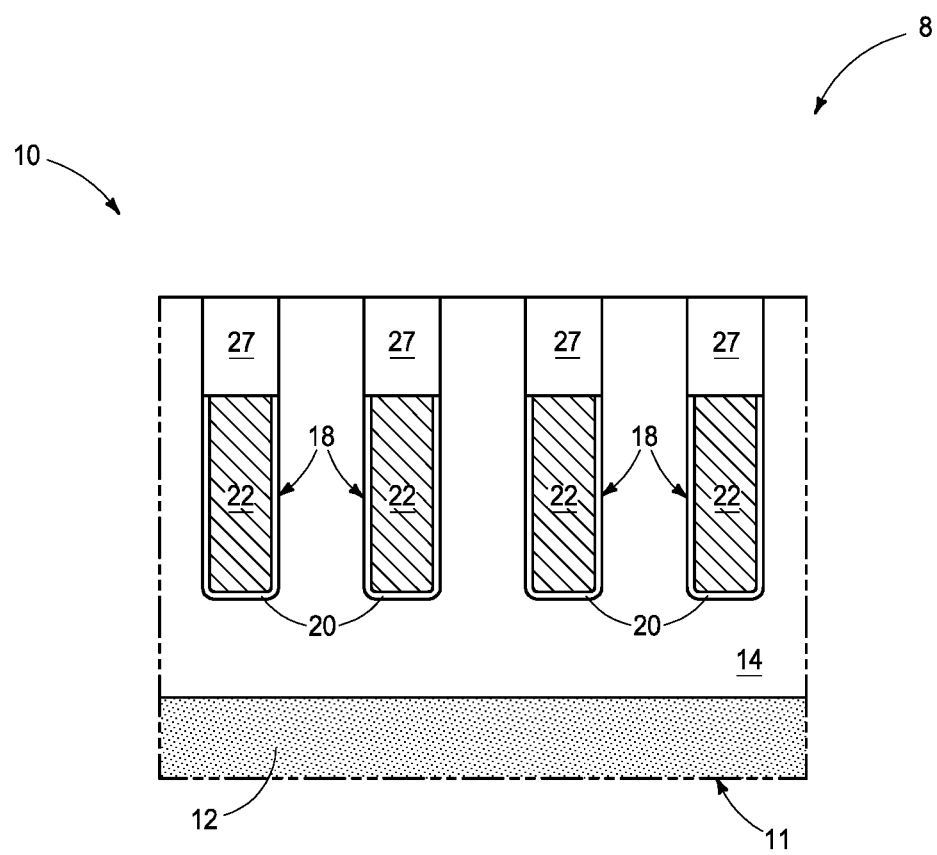
FIG. 5 is a sectional view taken through line 5-5 in FIGS. 1-3.

Embodiments of the invention encompass methods of forming an elevationally-extending conductor laterally between a pair of structures and a construction of integrated circuitry independent of method of manufacture. Method embodiments are initially described with reference to FIGS. 1-13.

Referring to FIGS. 1-5, an example fragment of a substrate structure 8 comprises an array or array area 10 that in one embodiment may comprise memory cells fabricated relative to a base substrate 11. Substrate 11 may comprise any one or more of conductive/conductor/conducting (i.e., electrically herein), semiconductive/semiconductor/semiconducting, and insulative/insulator/insulating (i.e., electrically herein) materials. Various materials have been formed elevationally over base substrate 11. Materials may be aside, elevationally inward, or elevationally outward of the FIGS. 1-5-depicted materials. For example, other partially or wholly fabricated components of integrated circuitry may be provided somewhere above, about, or within base substrate 11. Control and/or other peripheral circuitry for operating components within a memory array may also be fabricated, and may or may not be wholly or partially within a memory array or sub-array. Further, multiple sub-arrays may also be fabricated and operated independently, in tandem, or otherwise relative one another. As used in this document, a "sub-array" may also be considered as an array.

Base substrate 11 comprises semiconductor material 12 (e.g., appropriately, and variously, doped monocrystalline silicon), trench isolation regions 14 (e.g., silicon nitride and/or doped or undoped silicon dioxide), and active area regions 16 comprising suitably-doped semiconductor material 12. In one embodiment and as will be shown, structure 8 will comprise memory cells individually comprising a field effect transistor 25 and a capacitor (not shown in FIGS. 1-5). However as will be apparent from the continuing discussion, fabrication of other memory cells as well as fabrication of a conductive via regardless of type of circuitry, and a structure of integrated circuitry independent of method of manufacture, are contemplated in accordance with embodiments of the invention. In the depicted example, field effect transistors 25 are shown to be in the form of recessed access devices (RADs). Such include access line constructions 18 buried in base substrate 11 and which comprise a gate insulator 20 (e.g., comprising, consisting essentially of, or consisting of silicon dioxide and/or silicon nitride) and conductive gate material 22 (e.g., comprising, consisting essentially of, or consisting of conductively-doped semiconductor material and/or metal material). Insulator material 27 (e.g., comprising, consisting essentially of, or consisting of silicon nitride and/or doped or undoped silicon dioxide) is shown above access line constructions 18. Individual field effect transistors 25 comprise a pair of source/drain regions 24, 26 laterally outward of and above access line constructions 18. When suitable voltage is applied to gate material 22 of an access line construction 18, a conductive channel can form within semiconductor material 12 proximate gate insulator 20 such that current is capable of flowing between a pair of source/drain regions 24 and 26 under the access line construction 18 within an individual active area region 16. Thus, in the example embodiment, each active area region 16 comprises two field effect transistors 25 with each sharing a central source/drain region 26.

Structures/constructions 28 have been fabricated above base substrate 11. The discussion proceeds with fabrication relative to a pair of immediately-adjacent structures 28 in a method of forming an elevationally-extending conductor laterally between structures 28 of such pair. Individual structures 28 have been formed to comprise an elevationally-extending-conductive via 30 and a conductive line 32 electrically coupled to and crossing above conductive via 30. In one embodiment and as shown, individual conductive lines 32 are directly electrically coupled to and directly against tops 37 of conductive vias 30. In one embodiment, conductive line 32 comprises first conductive material 34 and conductive via 30 comprises second conductive material 36 of different composition from that of first conductive material 34. In one embodiment, first conductive material 34 comprises metal material (e.g., one or more of TiN, Ti, WN, WSi$_x$, etc.). In one embodiment, second conductive material 36 comprises conductively-doped semiconductor material (e.g., phosphorus-doped polysilicon). Conductive line 32 and conductive via 30 have opposing sides 35 and 33, respectively, in a vertical cross-section (e.g., the cross-section depicted by FIG. 2). Structures 28 are shown as comprising insulating materials 40, 41, and 42, which may be of the same or different composition relative one another (e.g., silicon nitride and/or doped or undoped silicon dioxide).

Elevationally-extending-insulative material is formed along opposing sides 35 and 33 of conductive via 30 and conductive line 32, respectively, in the vertical cross-section. Such is shown as including the forming of a laterally-inner-insulator material 46 comprising, consisting essentially of, or consisting of silicon, oxygen, and carbon laterally-outward of opposing sides 33 of conductive via 30 and of opposing sides 35 of conductive line 32 in the vertical cross-section. Ideally, the carbon is bonded to the silicon as opposed to being present as an un-bonded dopant, and material 46 comprises, consists essentially of, or consists of a silicon oxycarbide. In one embodiment, laterally-inner-insulator material 46 comprises greater than 4.0 atomic percent carbon and less than 15.0 atomic percent carbon. In one embodiment, laterally-inner-insulator material 46 has k (dielectric constant) greater than 4.2 and less than 4.5. An example thickness for laterally-inner-insulator material 46 is 10 Angstroms to 30 Angstroms. In one embodiment, structure 28 extends into an opening (FIGS. 1 and 2) in base substrate 11, insulator material 46 at least partially lines that opening, and an insulating material 56 (e.g., silicon nitride) is also in such opening. As shown, laterally-inner-insulator material 46 comprises opposing sides 47.

Figure 6:
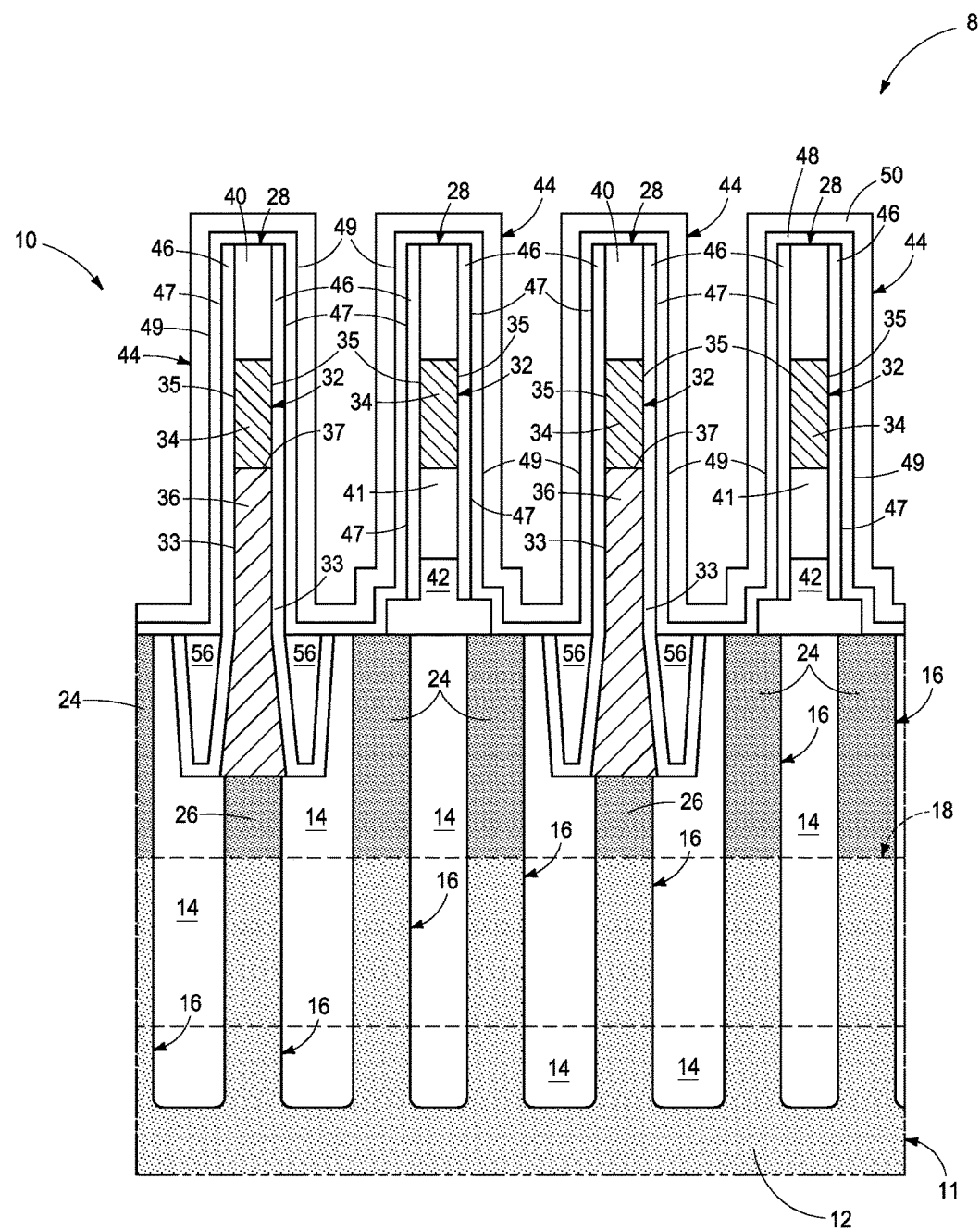
FIG. 6 is a view of the substrate as shown in FIG. 2 at a processing step subsequent to that shown by FIG. 2.

Referring to FIG. 6, a laterally-intervening-insulator material 48 comprising, consisting essentially of, or consisting of silicon and oxygen (e.g., silicon dioxide) is formed laterally-outward of opposing sides 47 of laterally-inner-insulator material 46 in the vertical cross-section. Laterally-intervening-insulator material 48 comprises less carbon, if any, than laterally-inner-insulator material 46. In one embodiment, laterally-intervening-insulator material 48 is formed directly against laterally-inner-insulator material 46. Laterally-intervening-insulator material 48 may be considered as having opposing sides 49. A laterally-outer-insulator material 50 comprising, consisting essentially of, or consisting of silicon, oxygen, and carbon (e.g., a silicon oxycarbide having carbon bonded with silicon) has been formed laterally-outward of opposing sides 49 of laterally-intervening-insulator material 48 in the vertical cross-section. Laterally-outer-insulator material 50 comprises more carbon than laterally-inner-insulator material 46. In one embodiment, laterally-outer-insulator material 50 is formed directly against laterally-intervening-insulator material 48. Regardless, and in one embodiment, elevationally-extending-insulative material 44 has been formed along opposing sides 35 of conductive line 32 and along opposing sides 33 of conductive via 30.

In one embodiment, laterally-intervening-insulator material 48 is devoid of carbon, and in another embodiment comprises carbon. In this document, "devoid of carbon" means from 0 atomic percent carbon to no more than 0.01 atomic percent carbon, with a material that comprises carbon having more than 0.01 atomic percent carbon. In one embodiment, laterally-intervening-insulator material 48 comprises at least 1.0 atomic percent carbon, and in one embodiment comprises no more than 4.0 atomic percent carbon. In one embodiment, laterally-intervening-insulator material 48 has k no greater than 4.1. An example thickness for laterally-intervening-insulator material 48 is 30 Angstroms to 50 Angstroms.

In one embodiment, laterally-outer-insulator material 50 comprises at least 15.0 atomic percent carbon, in one embodiment comprises no more than 30 atomic percent carbon, and in one embodiment comprises no more than 20 atomic percent carbon. In one embodiment, laterally-outer-insulator material 50 has k of at least 4.5, in one embodiment no greater than 6.5, and in one embodiment no greater than 5.3.

Elevationally-extending-conductor material is formed laterally between and along elevationally-extending insulative material 44 in the vertical cross-section. One example embodiment of doing so is next described with reference to FIGS. 7-13.

Figure 7:
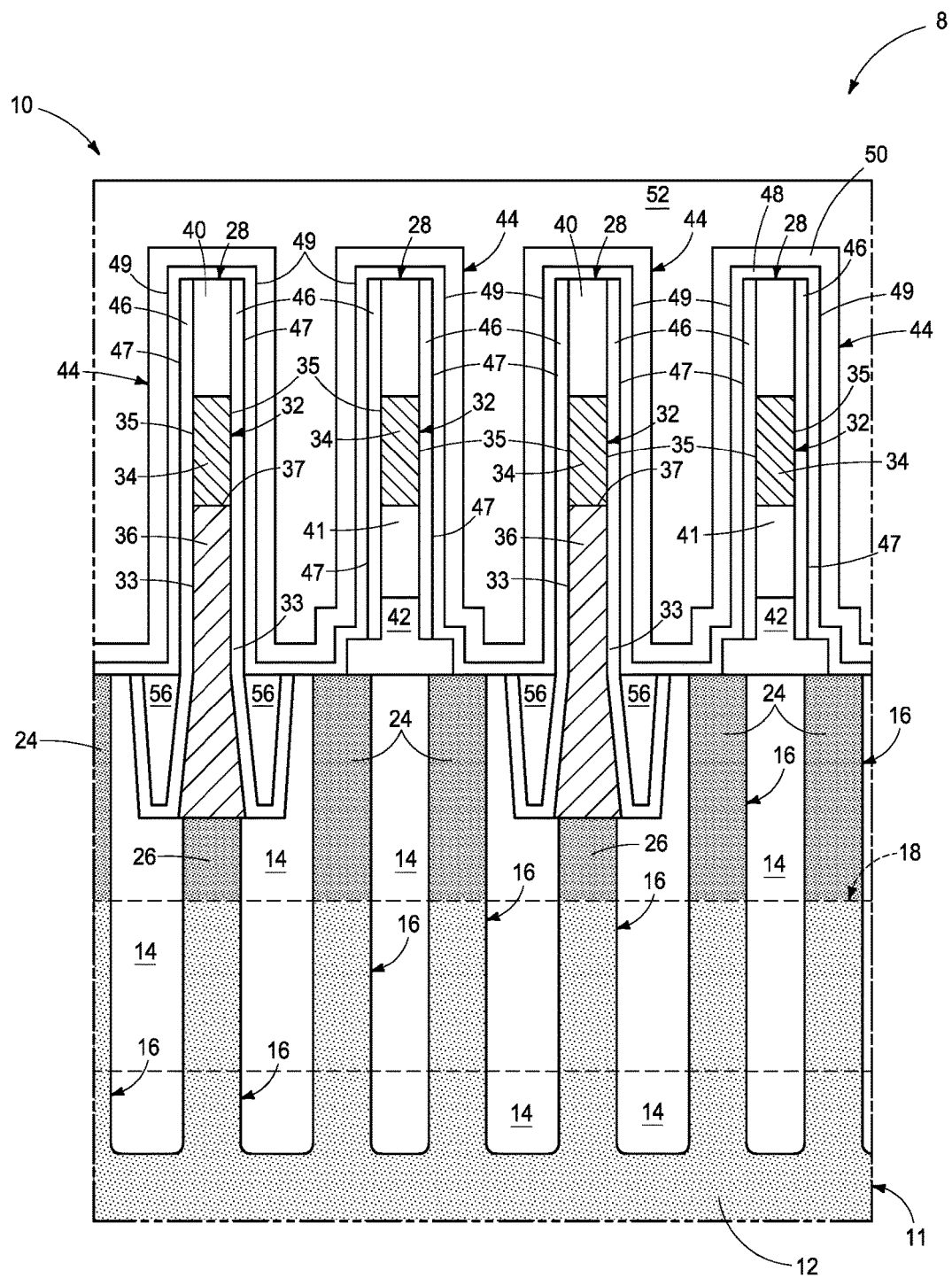
FIG. 7 is a view of the FIG. 6 substrate at a processing step subsequent to that shown by FIG. 6.

Referring to FIG. 7, and in one embodiment, insulator material 52 has been formed over insulative material 44 to fill and overfill remaining void space that is laterally between structures 28. An example material, and by way of example only, is a spin-on-dielectric.

Figure 8:
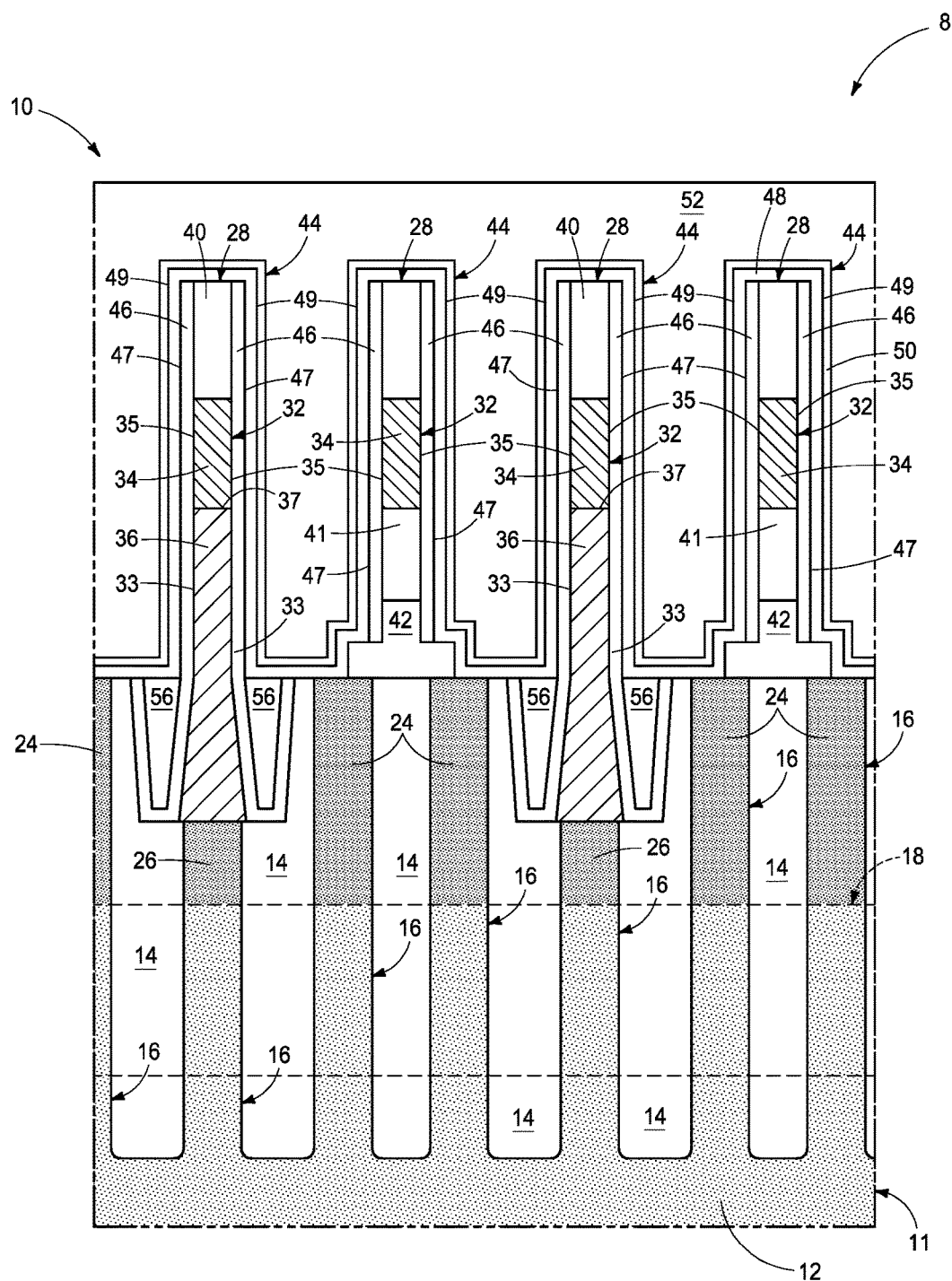
FIG. 8 is a view of the FIG. 7 substrate at a processing step subsequent to that shown by FIG. 7.

Referring to FIG. 8, insulator material 52 has been densified which, in one embodiment, has reduced lateral thickness of laterally-outer-insulator material 50. Such may, for example, result from driving carbon out of insulator material 50 into insulator material 52 whereby the laterally and elevationally-outermost portions of insulator material 50 convert to silicon dioxide.

Figure 9:
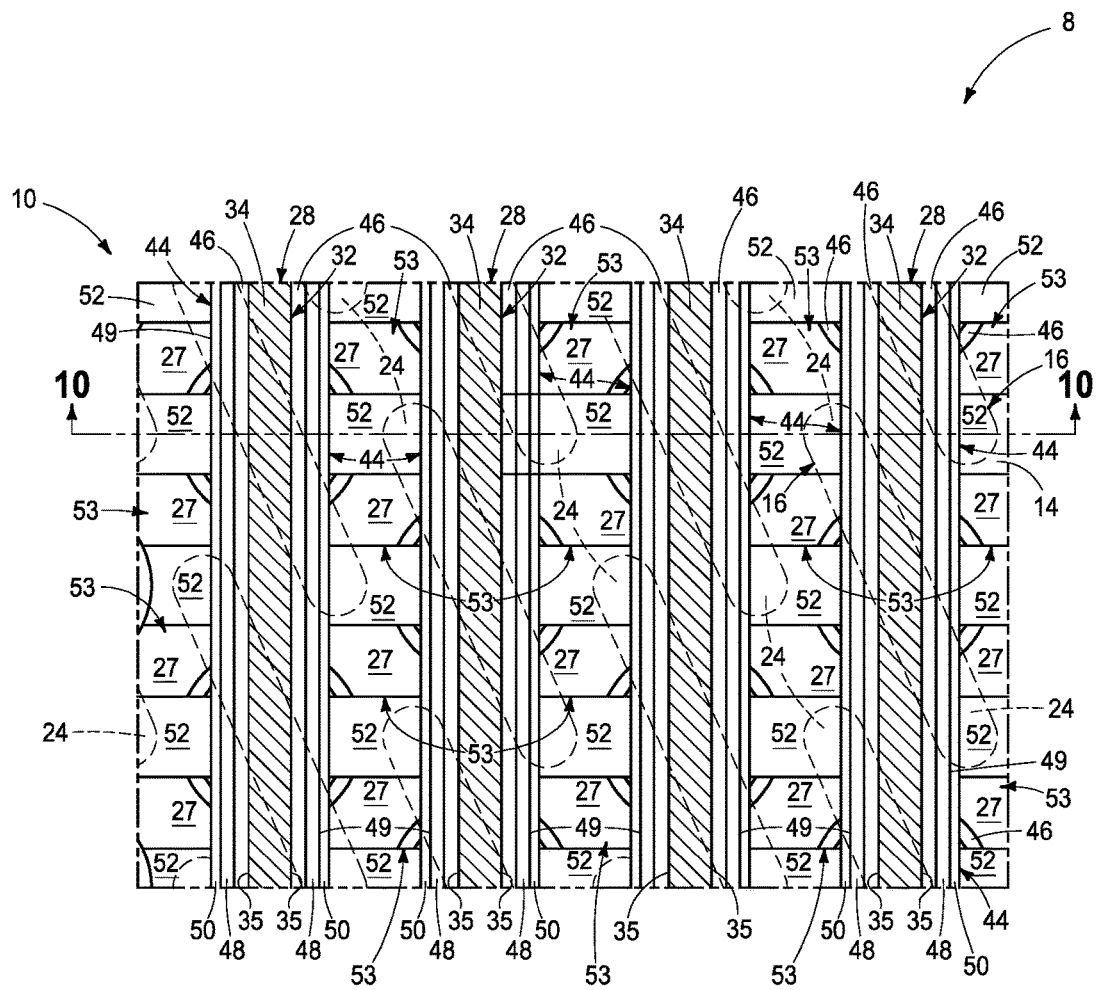
FIG. 9 is a view of the FIG. 8 substrate at a processing step subsequent to that shown by FIG. 8, and is taken through line 9-9 in FIG. 10.
Figure 10:
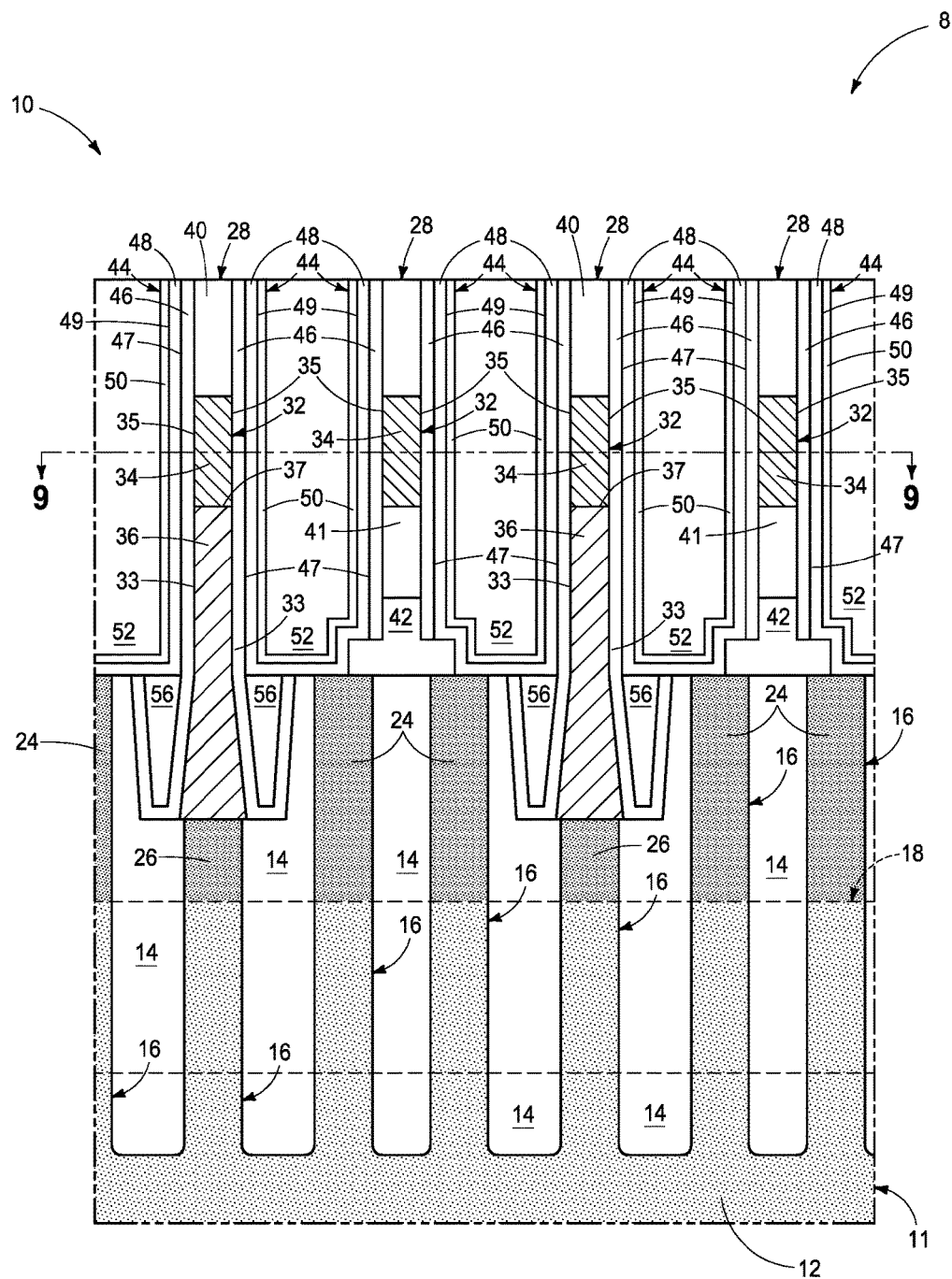
FIG. 10 is a sectional view taken through line 10-10 in FIG. 9.

Referring to FIGS. 9 and 10, and in one embodiment, insulator material 52 has been planarized back and patterned to form openings 53 (FIG. 9) while leaving source/drain regions 24 covered with insulator material 52.

Figure 11:
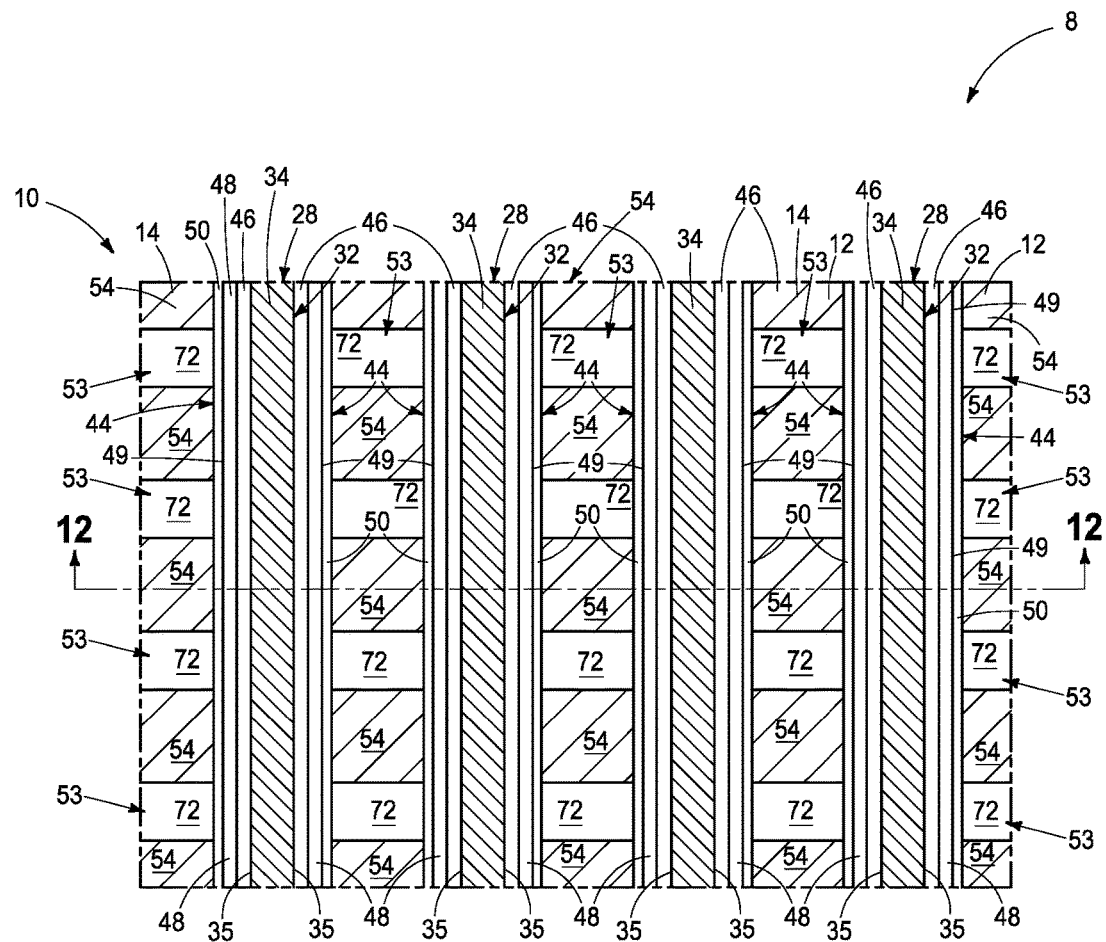
FIG. 11 is a view of the FIG. 10 substrate at a processing step subsequent to that shown by FIG. 10, and is taken through line 11-11 in FIG. 12.
Figure 12:
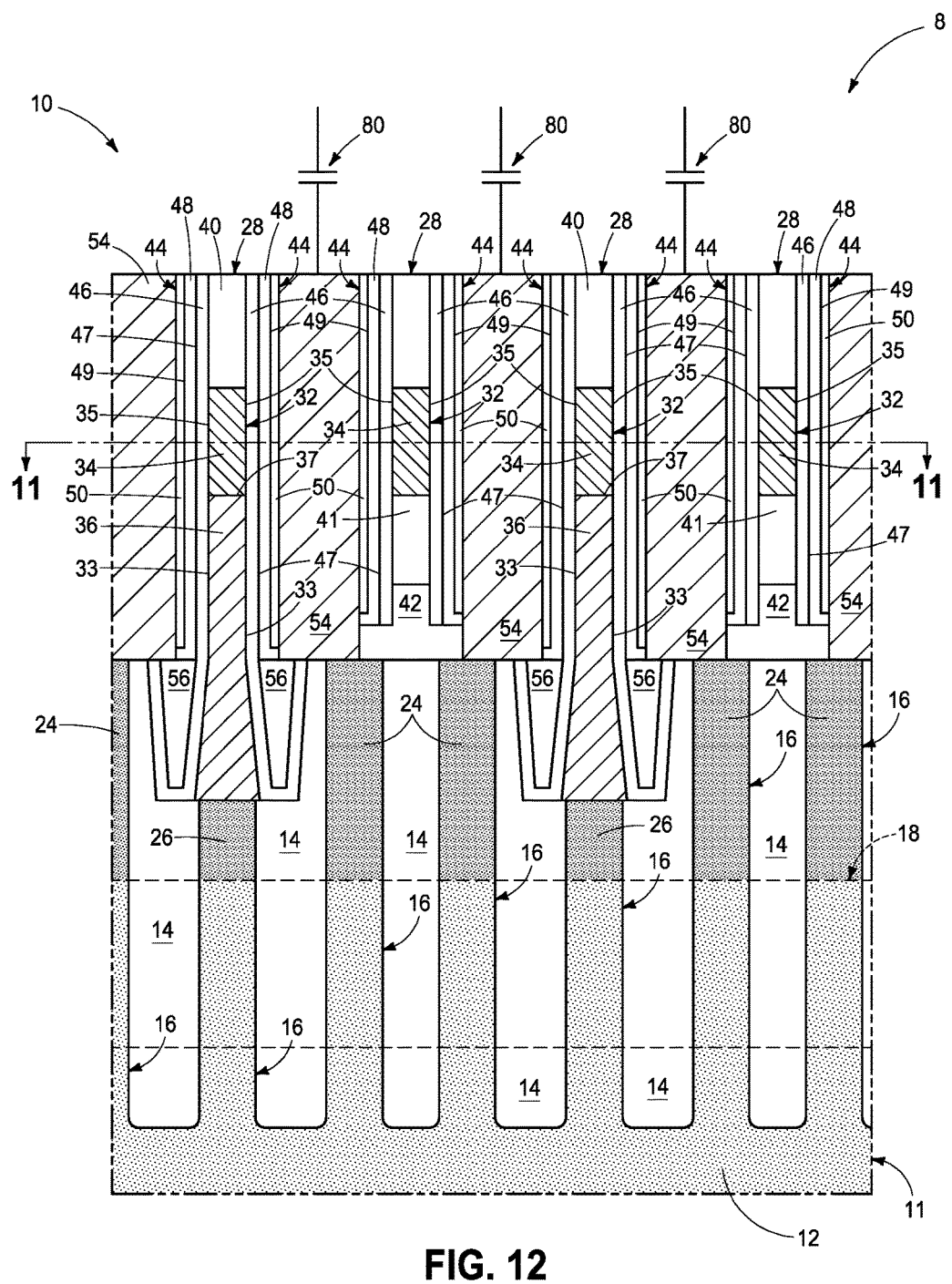
FIG. 12 is a sectional view taken through line 12-12 in FIG. 11.

Referring to FIGS. 11 and 12, and in one embodiment, dielectric material 72 (e.g., silicon nitride) has been formed in openings 53 and insulator material 52 (not shown) has been removed. Insulative material 44 has then (or earlier) been subjected to a suitable etch to expose source/drain regions 24. Elevationally-extending-conductor material 54 has then been formed laterally between and along insulative material 44 in the vertical cross-section (e.g., in place of removed insulator material 52). In one embodiment, such comprises metal material. In one embodiment, such comprises conductively-doped semiconductor material (e.g., phosphorus-doped polysilicon) directly against source/drain region 24.

In one embodiment, the forming of insulative material 44 (e.g., FIG. 6) is conducted onto a substrate (e.g., construction 8 in FIGS. 1-5) that comprises structures 28. In such embodiment, the forming of insulative material 44 comprises sequentially forming at least the laterally-intervening-insulator material 48 and the laterally-outer-insulator material 50 in situ in a deposition chamber (not shown) without removing the substrate from the deposition chamber between starting to form laterally-intervening-insulator material 48 to starting to form the laterally-outer-insulator material 50, and ideally not until deposition of all laterally-outer-insulator material 50 that is being deposited. In one such embodiment, laterally-inner-insulator material 46 may also be formed in situ (not shown) with materials 48 and 50. For example, all of materials 46, 48, and 50 could be deposited to collectively fill the openings in base substrate 11 (e.g., no insulating material 56 being deposited), followed by dry etching of materials 46, 48, and 50 to clear such from covering source/drain regions 24. Regardless, an example deposition tool is a remote plasma chemical vapor deposition reactor/tool (e.g., Striker available from LAM Research Corporation of Fremont, Calif.) operated at 0.5 Torr to 30.0 Torr chamber pressure, 150° C. to 450° C. susceptor temperature, 2,000 Watts to 5,000 Watts power, flow of a suitable silicon, oxygen, and carbon-containing precursor at 5 sccm to 25 sccm, $H_2$ flow of 200 sccm to 1,000 sccm, and $O_2$ flow of 1.5 sccm to 50 sccm (e.g., with the quantity of the $O_2$ flow and the $H_2$ flow being used to control quantity of carbon in the respective layers).

Figure 13:
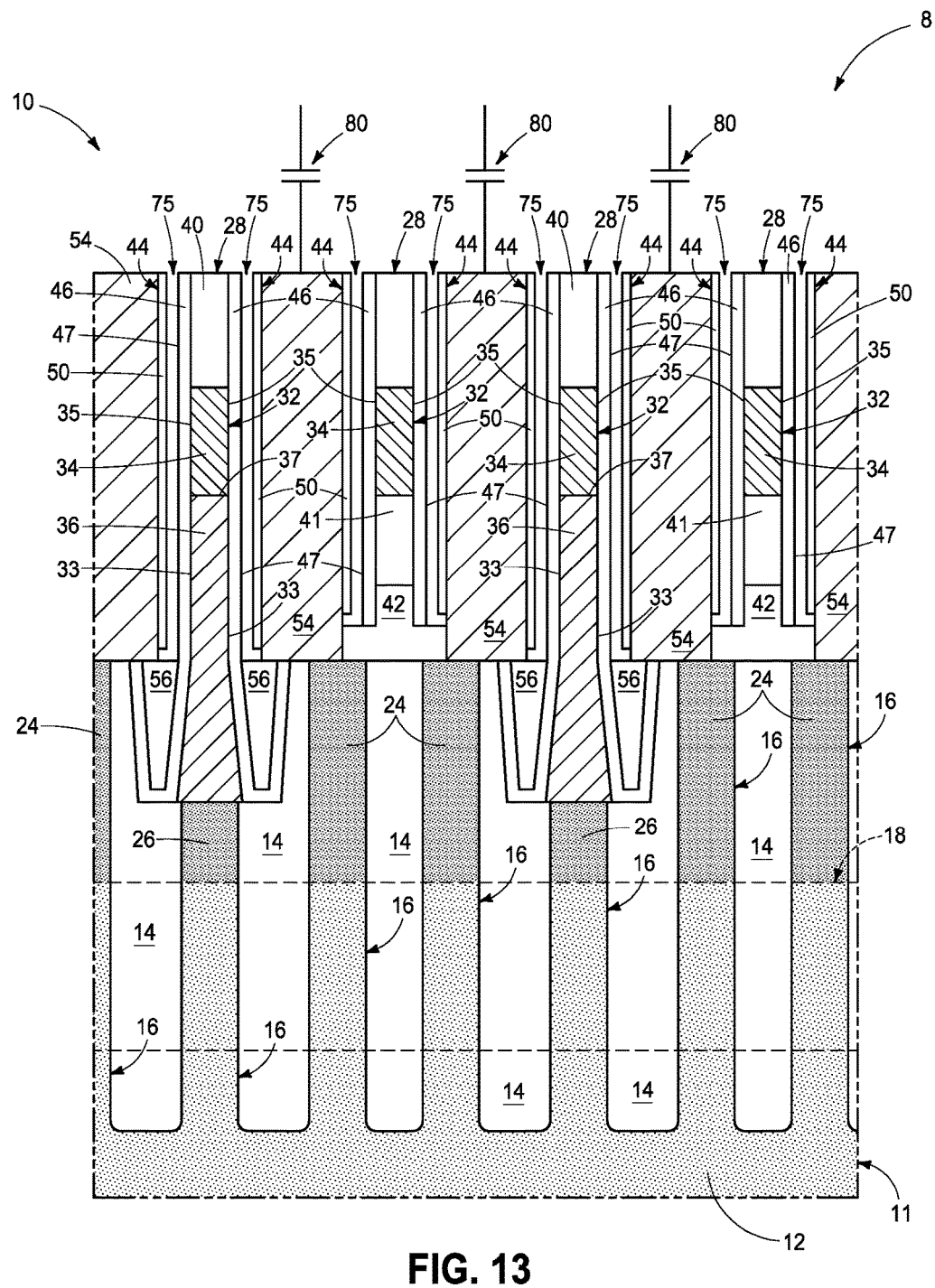
FIG. 13 is a view of the FIG. 12 substrate at a processing step subsequent to that shown by FIG. 12, or may be considered as an alternate embodiment to that shown by FIG. 12.

Laterally-intervening-insulator material 48 may wholly, partially, or not at all remain as part of a finished circuit construction. In one embodiment, and as shown in FIG. 13, laterally-intervening-insulator material 48 (not shown) has been removed from being laterally between pairs of structures 28 to form a pair of void spaces 75 (e.g., air gaps) that individually are laterally between laterally-inner-insulator material 46 and laterally-outer-insulator material 50. Such act of removing may occur before or after forming conductor material 54. In one embodiment, at least a majority (i.e., more than half) of the removing occurs after forming conductor material 54. An example technique for removing $SiO_2$ or a low carbon-content silicon oxycarbide material 48 as described herein is etching using dilute HF (e.g., 100:1 to 1,000:1 by volume $H_2O:HF$). In one embodiment, laterally-intervening-insulator material 48 (i.e., at least some) remains in a finished circuit construction. In one embodiment, void spaces 75 individually are laterally between and extend elevationally along at least a majority of elevational thickness of laterally-inner-insulator material 46 and of elevational thickness of laterally-outer-insulator material 50 in the vertical cross-section. In one embodiment and as shown, structure 8 may comprise memory cells individually comprising a field effect transistor 25 (FIG. 3) and a capacitor 80 (FIGS. 12 and 13).

Embodiments of the invention also encompass constructions of integrated circuitry independent of method of manufacture. However, any of the structural attributes described above with respect to method embodiments may be found in structural aspects of the invention and vice versa. In one embodiment, a pair of structures (e.g., 28) individually comprise an elevationally-extending conductive via (e.g., 30) and a conductive line (e.g., 32) electrically coupled to and crossing above the conductive via. The conductive line and the conductive via respectively have opposing sides (e.g., 35, 33, respectively) in a vertical cross-section. Elevationally-extending-insulative material (e.g., 44) is along the opposing sides of the conductive line and the conductive via in the vertical cross-section. The insulative material comprises a laterally-inner-insulator material (e.g., 46) comprising silicon, oxygen, and carbon laterally outward of the opposing sides of the conductive via and the conductive line in the vertical cross-section. A laterally-intervening-insulator material (e.g., 48) comprising silicon and oxygen is laterally-outward of the opposing sides of the laterally-inner-insulator material (e.g., 47) in the vertical cross-section. The laterally-intervening-insulator material comprises less carbon, if any, than the laterally-inner-insulator material. A laterally-outer-insulator material (e.g., 50) comprising silicon-oxygen- and carbon is laterally-outward of opposing sides (e.g., 49) of the laterally-intervening-insulator material in the vertical cross-section. The laterally-outer-insulator material comprises more carbon than the laterally-inner-insulator material. Elevationally-extending conductor material (e.g., 54) is laterally between and along insulative material 44 in the vertical cross-section.

Any other attribute(s) or aspect(s) as shown and/or described herein with respect to other embodiments may be used.

In one embodiment, a pair of structures (e.g., 28) individually comprise an elevationally-extending conductive via (e.g., 30) and a conductive line (e.g., 32) electrically coupled to and crossing above the conductive via. The conductive line and the conductive via respectively have opposing sides (e.g., 35, 33, respectively) in a vertical cross-section. Elevationally-extending-insulative material (e.g., 44) is along the opposing sides of the conductive line and the conductive via in the vertical cross-section. The insulative material comprises a laterally-inner-insulator material (e.g., 46) comprising silicon, oxygen, and carbon laterally outward of the opposing sides of the conductive via and the conductive line in the vertical cross-section. A laterally-outer-insulator material (e.g., 50) comprising silicon, oxygen, and carbon is laterally-outward of opposing sides (e.g., 47) of the laterally-inner-insulator material in the vertical cross-section. The laterally-outer-insulator material comprises more carbon than the laterally-inner-insulator material. A void space (e.g., 75) is laterally between and extends elevationally along at least a majority of elevational thickness of the laterally-inner-insulator material and of elevational thickness of the laterally-outer-insulator material in the vertical cross-section. Elevationally-extending conductor material (e.g., 54) is laterally between and along insulative material 44 in the vertical cross-section.

Any other attribute(s) or aspect(s) as shown and/or described herein with respect to other embodiments may be used.

In one embodiment, a construction of integrated circuitry comprises a conductive line extending over a plurality of circuit elements. The conductive line includes a side surface. An insulating structure is along the side surface of the conductive line. The insulating structure comprises a first insulator material and a second insulator material. The first insulator material is between the side surface of the conductive line and the second insulator material. The first insulator material comprises silicon, oxygen, and carbon. The second insulator material comprises silicon, oxygen, and carbon. Any other attribute(s) or aspect(s) as shown and/or described herein with respect to other embodiments may be used.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction along a primary substrate surface and may be relative to which the substrate is processed during fabrication, and vertical is a direction generally orthogonal thereto. Further, "vertical" and "horizontal" as used herein are generally perpendicular directions relative one another and independent of orientation of the substrate in three-dimensional space. Additionally, "elevationally-extending" and "extending elevationally" refer to a direction that is angled away by at least 45° from horizontal. Further, "extend(ing) elevationally" and "elevationally-extending" with respect to a field effect transistor are with reference to orientation of the transistor's channel length along which current flows in operation between the source/drain regions. For bipolar junction transistors, "extend(ing) elevationally" and "elevationally-extending" are with reference to orientation of the base length along which current flows in operation between the emitter and collector.

Further, "directly above" requires at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Further, unless otherwise stated, each material may be formed using any suitable or yet-to-be-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region (s), or structure(s) result(s) in no physical touching contact of the stated materials, regions, or structures relative one another.

Herein, regions-materials-components are "electrically coupled" relative one another if in normal operation electric current is capable of continuously flowing from one to the other, and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Additionally, "metal material" is any one or combination of an elemental metal, a mixture or an alloy of two or more elemental metals, and any conductive metal compound.

In this document, a selective etch or removal is an etch or removal where one material is removed relative to another stated material or materials at a rate of at least 2.0:1. Further, selectively growing or selectively forming is growing or forming one material relative to another stated material or materials at a rate of at least 2.0:1 for at least the first 100 Angstroms of growing or forming.

CONCLUSION

In some embodiments, a method of forming an elevationally-extending conductor laterally between a pair of structures comprises forming a pair of structures individually comprising an elevationally-extending-conductive via and a conductive line electrically coupled to and crossing above the conductive via. The conductive line and the conductive via respectively have opposing sides in a vertical cross-section. Elevationally-extending-insulative material is formed along the opposing sides of the conductive via and the conductive line in the vertical cross-section. The forming of the insulative material comprises forming a laterally-inner-insulator material comprising silicon, oxygen, and carbon laterally-outward of the opposing sides of the conductive via and the conductive line in the vertical cross-section. A laterally-intervening-insulator material comprising silicon and oxygen is formed laterally-outward of opposing sides of the laterally-inner-insulator material in the vertical cross-section. The laterally-intervening-insulator material comprises less carbon, if any, than the laterally-inner-insulator material. A laterally-outer-insulator material comprising silicon, oxygen, and carbon is formed laterally-outward of opposing sides of the laterally-intervening-insulator material in the vertical cross-section. The laterally-outer-insulator material comprises more carbon than the laterally-inner-insulator material. Elevationally-extending-conductor material is formed laterally between and along the insulative material in the vertical cross-section.

In some embodiments, a construction of integrated circuitry comprises a pair of structures individually comprising an elevationally-extending-conductive via and a conductive line electrically coupled to and crossing above the conductive via. The conductive line and the conductive via respectively having opposing sides in a vertical cross-section. Elevationally-extending-insulative material is along the opposing sides of the conductive via and the conductive line in the vertical cross-section. The insulative material comprises a laterally-inner-insulator material comprising silicon, oxygen, and carbon laterally-outward of the opposing sides of the conductive via and the conductive line in the vertical cross-section. A laterally-intervening-insulator material comprising silicon and oxygen is laterally-outward of opposing sides of the laterally-inner-insulator material in the vertical cross-section. The laterally-intervening-insulator material comprises less carbon, if any, than the laterally-inner-insulator material. A laterally-outer-insulator material comprising silicon, oxygen, and carbon is laterally-outward of opposing sides of the laterally-intervening-insulator material in the vertical cross-section. The laterally-outer-insulator material comprises more carbon than the laterally-inner-insulator material. Elevationally-extending-conductor material is laterally between and along the insulative material in the vertical cross-section.

In some embodiments, a construction of integrated circuitry comprises a pair of structures individually comprising an elevationally-extending-conductive via and a conductive line electrically coupled to and crossing above the conductive via. The conductive line and the conductive via respectively having opposing sides in a vertical cross-section. Elevationally-extending-insulative material is along the opposing sides of the conductive via and the conductive line in the vertical cross-section. The insulative material comprises a laterally-inner-insulator material comprising silicon, oxygen, and carbon laterally-outward of the opposing sides of the conductive via and the conductive line in the vertical cross-section. A laterally-outer-insulator material comprising silicon, oxygen, and carbon is laterally-outward of opposing sides of the laterally-inner-insulator material in the vertical cross-section. The laterally-outer-insulator material comprises more carbon than the laterally-inner-insulator material. A void space is laterally between and extends elevationally along at least a majority of elevational thickness of the laterally-inner-insulator material and of elevational thickness of the laterally-outer-insulator material in the vertical cross-section. Elevationally-extending-conductor material is laterally between and along the insulative material in the vertical cross-section.

In some embodiments, a construction of integrated circuitry comprises a conductive line extending over a plurality of circuit elements. The conductive line includes a side surface. An insulating structure is along the side surface of the conductive line. The insulating structure comprises a first insulator material and a second insulator material. The first insulator material is between the side surface of the conductive line and the second insulator material. The first insulator material comprises silicon, oxygen, and carbon. The second insulator material comprises silicon, oxygen, and carbon.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming an elevationally-extending conductor laterally between a pair of structures, comprising:
    forming a pair of structures individually comprising an elevationally-extending-conductive via and a conductive line electrically coupled to and crossing above the elevationally-extending-conductive via, the conductive line and the elevationally-extending-conductive via respectively having opposing sides in a vertical cross-section;
    after forming said pair of structures, forming elevationally-extending-insulative material along the opposing sides of the elevationally-extending-conductive via and the conductive line in the vertical cross-section, the forming of the elevationally-extending-insulative material comprising:
    forming a laterally-inner-insulator material comprising silicon, oxygen, and carbon laterally-outward of the opposing sides of the elevationally-extending-conductive via and the conductive line in the vertical cross-section;
    forming a laterally-intervening-insulator material laterally outward of and laterally along the laterally-inner-insulator material, the laterally-intervening-insulator material comprising silicon and oxygen laterally-outward of opposing sides of the laterally-inner-insulator material in the vertical cross-section;
    the laterally-intervening-insulator material comprising from 0 atomic percent carbon to greater than 0 atomic percent carbon and if greater than 0 atomic percent carbon being less than an amount of atomic percent carbon in the laterally-inner-insulator material; and
    forming a laterally-outer-insulator material laterally outward of and laterally along the laterally-intervening-insulator material, the laterally-outer-insulator material comprising silicon, oxygen, and carbon laterally-outward of opposing sides of the laterally-intervening-insulator material in the vertical cross-section; the laterally-outer-insulator material comprising more carbon than the laterally-inner-insulator material; and
    forming elevationally-extending-conductor material laterally between and laterally along the elevationally-extending-insulative material in the vertical cross-section.

2. The method of claim 1 wherein the laterally-intervening-insulator material has 0 atomic percent carbon therein.

3. The method of claim 1 wherein the laterally-intervening-insulator material comprises carbon.

4. The method of claim 3 wherein the laterally-intervening-insulator material comprises at least 1.0 atomic percent carbon.

5. The method of claim 1 wherein the laterally-inner-insulator material comprises greater than 4.0 atomic percent carbon and less than 9.0 atomic percent carbon, the laterally-intervening-insulator material comprises no more than 4.0 atomic percent carbon, and the laterally-outer-insulator material comprises at least 9.0 atomic percent carbon.

6. The method of claim 5 wherein the laterally-intervening-insulator material comprises carbon.

7. The method of claim 5 wherein the laterally-outer-insulator material comprises no more than 25 atomic percent carbon.

8. The method of claim 7 wherein the laterally-outer-insulator material comprises no more than 15 atomic percent carbon.

9. The method of claim 1 wherein the laterally-inner-insulator material has k greater than 4.2 and less than 4.5, the laterally-intervening-insulator material has k no greater than 4.1, and the laterally-outer-insulator material has k of at least 4.5.

10. The method of claim 1 comprising forming the elevationally-extending-insulative material onto a substrate comprising the pair of structures; the forming of the elevationally-extending-insulative material comprising sequentially forming the laterally-inner-insulator material, the laterally-intervening-insulator material, and the laterally-outer-insulator material in situ in a deposition chamber without removing the substrate from the deposition chamber between starting to form the laterally-inner-insulator material to starting to form the laterally-outer-insulator material.

11. The method of claim 1 comprising forming the laterally-outer-insulator material directly against the laterally-intervening-insulator material.

12. The method of claim 1 comprising forming the laterally-intervening-insulator material directly against the laterally-inner-insulator material.

13. The method of claim 12 comprising forming the laterally-outer-insulator material directly against the laterally-intervening-insulator material.

14. The method of claim 1 comprising reducing lateral thickness of the laterally-outer-insulator material before forming the elevationally-extending-conductor material.

15. The method of claim 1 comprising removing the laterally-intervening-insulator material from being laterally between the pair of structures to form a pair of void spaces that individually are laterally between the laterally-inner-insulator material and the laterally-outer-insulator material in a finished circuit construction.

16. The method of claim 15 wherein at least a majority of the removing occurs after forming the conductor material.

17. The method of claim 1 comprising leaving the laterally-intervening-insulator material in a finished circuit construction.

18. The method of claim 1 wherein each of the laterally-inner-insulator material and the laterally-outer-insulator material at least as initially formed consists essentially of silicon, oxygen, carbon.

19. A construction of integrated circuitry, comprising:
a pair of structures individually comprising an elevationally-extending-conductive via and a conductive line electrically coupled to and crossing above the elevationally-extending-conductive via, the conductive line and the elevationally-extending-conductive via respectively having opposing sides in a vertical cross-section;
elevationally-extending-insulative material along the opposing sides of the elevationally-extending-conductive via and the conductive line in the vertical cross-section, the elevationally-extending-insulative material comprising:
a laterally-inner-insulator material comprising silicon, oxygen, and carbon laterally-outward of the opposing sides of the elevationally-extending-conductive via and the conductive line in the vertical cross-section;
a laterally-intervening-insulator material laterally outward of and laterally along the laterally-inner-insulator material, the laterally-intervening-insulator material comprising silicon and oxygen laterally-outward of opposing sides of the laterally-inner-insulator material in the vertical cross-section;
the laterally-intervening-insulator material comprising from 0 atomic percent carbon to greater than 0 atomic percent carbon and if greater than 0 atomic percent carbon being less than an amount of atomic percent carbon in the laterally-inner-insulator material; and
a laterally-outer-insulator material laterally outward of and laterally along the laterally-intervening-insulator material, the laterally-outer-insulator material comprising silicon, oxygen, and carbon laterally-outward of opposing sides of the laterally-intervening-insulator material in the vertical cross-section, the laterally-outer-insulator material comprising more carbon than the laterally-inner-insulator material; and
elevationally-extending-conductor material laterally between and laterally along the elevationally-extending-insulative material in the vertical cross-section.

20. A construction of integrated circuitry, comprising:
a pair of structures individually comprising an elevationally-extending-conductive via and a conductive line electrically coupled to and crossing above the elevationally-extending-conductive via, the conductive line and the elevationally-extending-conductive via respectively having opposing sides in a vertical cross-section;
elevationally-extending-insulative material along the opposing sides of the elevationally-extending-conductive via and the conductive line in the vertical cross-section, the elevationally-extending-insulative material comprising:
a laterally-inner-insulator material comprising silicon, oxygen, and carbon that is everywhere laterally-outward of the opposing sides of the elevationally-extending-conductive via and the conductive line in the vertical cross-section;
a laterally-outer-insulator material laterally outward of and laterally along the laterally-inner-insulator material, the laterally-outer-insulator material comprising silicon, oxygen, and carbon laterally-outward of opposing sides of the laterally-inner-insulator material in the vertical cross-section, the laterally-outer-insulator material comprising more carbon than the laterally-inner-insulator material; and
a void space laterally between and extending elevationally along at least a majority of elevational thickness of the laterally-inner-insulator material and of elevational thickness of the laterally-outer-insulator material in the vertical cross-section; and
elevationally-extending-conductor material laterally between and laterally along the elevationally-extending-insulative material in the vertical cross-section.

* * * * *